US009495493B2

(12) United States Patent
Seo et al.

(10) Patent No.: US 9,495,493 B2
(45) Date of Patent: Nov. 15, 2016

(54) OVERCURRENT SIMULATION METHOD WHEN NAIL PENETRATES SECONDARY BATTERY AND RECORDING MEDIUM STORING THE PROGRAM

(71) Applicant: LG CHEM, LTD., Seoul (KR)

(72) Inventors: Se-Wook Seo, Daejeon (KR); Dal-Mo Kang, Daejeon (KR); Seung-Hun Jung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 115 days.

(21) Appl. No.: 14/525,310

(22) Filed: Oct. 28, 2014

(65) Prior Publication Data

US 2015/0145525 A1 May 28, 2015

(30) Foreign Application Priority Data

Nov. 25, 2013 (KR) .................. 10-2013-0143588
Aug. 21, 2014 (KR) .................. 10-2014-0108897

(51) Int. Cl.
| G01R 31/36 | (2006.01) |
| G06F 17/50 | (2006.01) |
| H01M 2/34 | (2006.01) |
| H01M 10/48 | (2006.01) |
| H01M 10/42 | (2006.01) |

(52) U.S. Cl.
CPC .......... *G06F 17/5036* (2013.01); *H01M 2/345* (2013.01); *H01M 10/425* (2013.01); *H01M 10/48* (2013.01); *G01R 31/3651* (2013.01); *H01M 10/4285* (2013.01); *H01M 2200/00* (2013.01)

(58) Field of Classification Search
CPC .. H01M 2/345; H01M 10/425; H01M 10/48; G06F 17/5036; G01R 31/36

USPC .......................................................... 324/555
See application file for complete search history.

(56) References Cited

U.S. PATENT DOCUMENTS

| 5,949,233 | A | 9/1999 | Mashiko | |
| 5,982,145 | A * | 11/1999 | Eguchi | H02J 7/0068 320/128 |
| 2003/0064257 | A1* | 4/2003 | Iwasaki | H01M 10/42 429/7 |
| 2005/0134230 | A1* | 6/2005 | Sato | H01M 10/4264 320/136 |
| 2005/0255376 | A1* | 11/2005 | Cho | H01M 2/34 429/61 |
| 2009/0085521 | A1* | 4/2009 | Kim | H02J 7/0031 320/134 |
| 2009/0187359 | A1* | 7/2009 | Hood | G01R 31/3606 702/63 |
| 2012/0141845 | A1 | 6/2012 | Byun et al. | |

(Continued)

FOREIGN PATENT DOCUMENTS

| JP | 9-322411 A | 12/1997 |
| JP | 11-273651 A | 10/1999 |

(Continued)

*Primary Examiner* — Son Le
*Assistant Examiner* — Akm Zakaria
(74) *Attorney, Agent, or Firm* — Birch, Stewart, Kolasch & Birch, LLP

(57) ABSTRACT

Disclosed is an overcurrent simulation method when a nail penetrates a secondary battery and a recording medium storing the program. The overcurrent simulation method according to the present disclosure constructs a safety device and a secondary battery equivalent circuit, and produces a nail penetration effect by changing a resistance value. In this instance, various current simulations may be obtained by changing a first metal sheet and a second metal sheet included in the safety device, and a resistance value limiting an overcurrent may be calculated.

16 Claims, 6 Drawing Sheets

(56) References Cited

U.S. PATENT DOCUMENTS

2012/0176095 A1* 7/2012 Okuda .................. H01M 10/44
  320/134
2013/0063850 A1* 3/2013 Kawamoto .............. H02H 3/08
  361/87

FOREIGN PATENT DOCUMENTS

| KR | 10-2006-0044412 A | 5/2006 |
| KR | 10-1244738 B1 | 3/2013 |
| KR | 10-2013-0071821 A | 7/2013 |

* cited by examiner

OVERCURRENT SIMULATION METHOD WHEN NAIL PENETRATES SECONDARY BATTERY AND RECORDING MEDIUM STORING THE PROGRAM

CROSS-REFERENCE TO RELATED APPLICATION

The present application claims priority to Korean Patent Application No. 10-2013-0143588 filed on Nov. 25, 2013 in the Republic of Korea and Korean Patent Application No. 10-2014-0108897 filed on Aug. 21, 2014 in the Republic of Korea, the disclosures of which are incorporated herein by reference.

BACKGROUND OF THE DISCLOSURE

Field of the Disclosure

The present disclosure relates to an overcurrent simulation method and a recording medium storing the program, and more particularly, to an overcurrent simulation method which simulates a direction and an amount of an overcurrent based on a resistance value of a safety device when a nail penetrates a secondary battery and the safety device, and a recording medium storing the program.

Description of the Related Art

Generally, a cell is greatly classified into a chemical cell and a physical cell, and a chemical cell may be classified into a primary cell and a secondary cell, and a fuel cell. The secondary cell includes a nickel/cadmium (N—Ca) secondary battery, a nickel/hydrogen (Ni-Mh) secondary battery, a sealed lead acid (SLA) secondary battery, a lithium (Li) ion secondary battery, a lithium (Li)-polymer secondary battery, and a reusable alkaline secondary battery.

Particularly, when a short circuit occurs in a lithium ion secondary battery due to penetration of a metal object or the like during use, an overcurrent flows in the battery, and with the increasing temperature and/or pressure, the risk of explosion and/or ignition will increase.

To prevent such accidents, a safety device is disclosed in Korean Unexamined Patent Publication No. 10-2013-0071821 by the Applicant. The safety device includes a first metal sheet, an insulator member, and a second metal sheet. The insulator member is interposed between the first metal sheet and the second metal sheet to electrically isolate the first metal sheet from the second metal sheet in a normal condition. Also, when a conductive object such as a metal penetrates the safety device and a secondary battery, the first metal sheet and the second metal sheet are electrically connected by the conductive object. In this instance, when an overcurrent occurs in the secondary battery due to penetration of the conductive object, the first metal sheet and the second metal sheet serve as a resistor to flow the overcurrent out of the secondary battery, thereby ensuring safety of the secondary battery in use.

In this instance, an amount and a direction of the overcurrent may be determined by a unique resistance value the first metal sheet and the second metal sheet have. Accordingly, a method for simulating the resistance value of the first metal sheet and the second metal sheet to determine the amount and the direction of the overcurrent is needed.

SUMMARY OF THE DISCLOSURE

The present disclosure is designed to solve the problem of the related art, and therefore the present disclosure is directed to providing an overcurrent simulation method which performs simulations by variously setting a resistance value of a first metal sheet and a second metal sheet included in a safety device and a recording medium storing the program.

To achieve the above object, an overcurrent simulation method according to the present disclosure is a method which simulates an overcurrent, in the event of penetration of a secondary battery, based on a resistance value of a safety device using an electronic circuit analysis program operating by a microprocessor, the overcurrent simulation method including (a) receiving, by the microprocessor, an input of a safety device including a first metal sheet, an insulator member and a second metal sheet, and at least two secondary battery equivalent circuits including a channel via which an overcurrent flows (hereinafter referred to as 'an overcurrent channel') in the event of penetration, through a variable resistor device, (b) receiving, by the microprocessor, an input of a resistance value of the first metal sheet and the second metal sheet, (c) receiving, by the microprocessor, an input of time information at which a resistance value of the insulator member in the safety device and a resistance value of the overcurrent channel in the secondary battery equivalent circuit go down to a resistance value of a conductive object sequentially in an order in which the conductive object penetrates the safety device and the at least two secondary batteries, (d) outputting, by the microprocessor, a current value on the overcurrent channel over time using the electronic circuit analysis program, and (e) calculating, by the microprocessor, a resistance value of the first metal sheet and the second metal sheet allowing a minimum magnitude of current to flow in the overcurrent channel.

The step (a) of the overcurrent simulation method according to the present disclosure may further include receiving an input of connection wiring information between the at least two secondary battery equivalent circuits and the safety device.

According to an exemplary embodiment of the present disclosure, the secondary battery equivalent circuit may include a voltage source exhibiting an output voltage of the secondary battery.

According to an exemplary embodiment of the present disclosure, the secondary battery equivalent circuit may further include a resistor device exhibiting an internal resistance of the secondary battery, and a capacitance device exhibiting an internal capacitance of the secondary battery.

According to an exemplary embodiment of the present disclosure, the internal resistance of the secondary battery may have resistance values corresponding to a secondary battery case, a cathode plate, a cathode active material, a separator, an anode plate, and an anode active material, and resistor devices representing the cathode plate, the cathode active material, the separator, and the anode plate, and the anode active material may be electrically connected in series.

According to an exemplary embodiment of the present disclosure, in the secondary battery equivalent circuit, the internal capacitance may be electrically connected in parallel to the resistor devices exhibiting the resistance of the cathode active material and the anode active material, respectively.

According to an exemplary embodiment of the present disclosure, the overcurrent channel may include a variable resistor device changing in resistance value based on preset time information, and a current sensor to measure a current value flowing through the variable resistor device.

According to an exemplary embodiment of the present disclosure, an initial value of the variable resistor device may be a resistance value representing an insulation state to show a state before the secondary battery is pierced.

To achieve the above object, a recording medium according to the present disclosure is a recording medium storing an electronic circuit analysis program used to simulate an overcurrent, in the event of penetration of a secondary battery, based on a resistance value of a safety device, the recording medium including (a) receiving an input of a safety device including a first metal sheet, an insulator member and a second metal sheet, and at least two secondary battery equivalent circuits including a channel via which an overcurrent flows (hereinafter referred to as 'an overcurrent channel') in the event of penetration, through a variable resistor device, (b) receiving an input of a resistance value of the first metal sheet and the second metal sheet, (c) receiving an input of time information at which a resistance value of the insulator member in the safety device and a resistance value of the overcurrent channel in the secondary battery equivalent circuit go down to a resistance value of a conductive object sequentially in an order in which the conductive object penetrates the safety device and the at least two secondary batteries, (d) outputting a current value on the overcurrent channel over time using the electronic circuit analysis program, and (e) calculating a resistance value of the first metal sheet and the second metal sheet allowing a minimum magnitude of current to flow in the overcurrent channel.

According to an exemplary embodiment of the present disclosure, the step (a) may further include receiving an input of connection wiring information between the at least two secondary battery equivalent circuits and the safety device.

According to an exemplary embodiment of the present disclosure, the secondary battery equivalent circuit may include a voltage source exhibiting an output voltage of the secondary battery.

According to an exemplary embodiment of the present disclosure, the secondary battery equivalent circuit may further include a resistor device exhibiting an internal resistance of the secondary battery, and a capacitance device exhibiting an internal capacitance of the secondary battery.

According to an exemplary embodiment of the present disclosure, the internal resistance of the secondary battery may have resistance values corresponding to a secondary battery case, a cathode plate, a cathode active material, a separator, an anode plate, and an anode active material, and resistor devices representing the cathode plate, the cathode active material, the separator, and the anode plate, and the anode active material may be electrically connected in series.

According to an exemplary embodiment of the present disclosure, in the secondary battery equivalent circuit, the internal capacitance may be electrically connected in parallel to the resistor devices exhibiting the resistance of the cathode active material and the anode active material, respectively.

According to an exemplary embodiment of the present disclosure, the overcurrent channel may include a variable resistor device changing in resistance value based on preset time information, and a current sensor to measure a current value flowing through the variable resistor device.

According to an exemplary embodiment of the present disclosure, an initial value of the variable resistor device may be a resistance value representing an insulation state to show a state before the secondary battery is pierced.

According to one aspect of the present disclosure, simulations may be performed by variously setting a resistance value of a first metal sheet and a second metal sheet included in a safety device.

According to another aspect of the present disclosure, a direction and an amount of overcurrent may be estimated without an actual penetration test.

According to still another aspect of the present disclosure, a resistance value of a first metal sheet and a second metal sheet allowing an amount of overcurrent to reduce may be calculated.

BRIEF DESCRIPTION OF THE DRAWINGS

The accompanying drawings illustrate a preferred embodiment of the present disclosure and together with the foregoing disclosure, serve to provide further understanding of the technical spirit of the present disclosure, and thus, the present disclosure is not construed as being limited to the drawing.

DESCRIPTION OF THE PREFERRED EMBODIMENT

Figure 1:
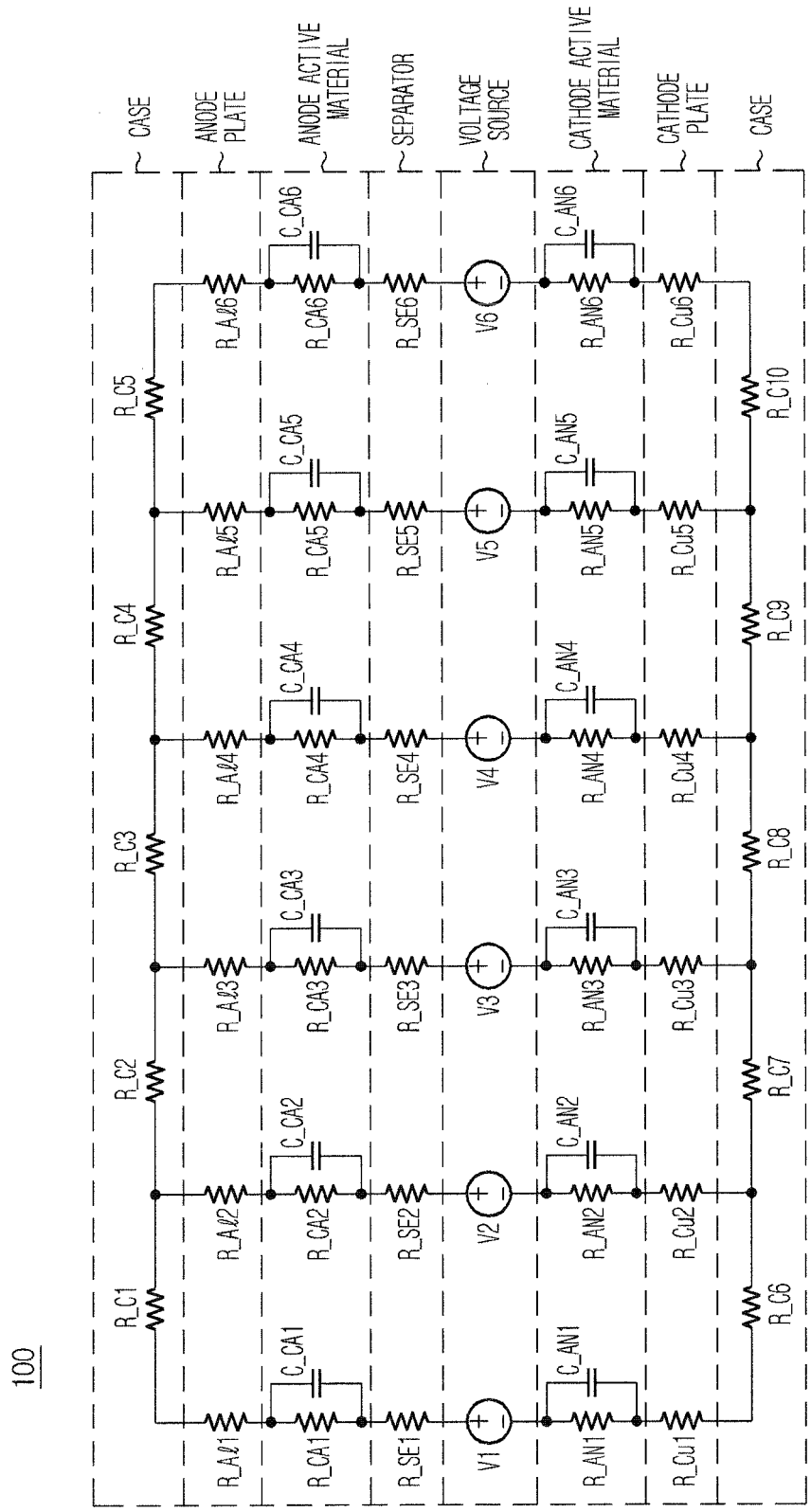
FIG. 1 is a secondary battery equivalent circuit diagram.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

An overcurrent simulation method according to the present disclosure is a method which simulates a direction and a magnitude of overcurrent based on a resistance value of a safety device when a pointed conductive object such as a nail penetrates a secondary battery. As described in the foregoing, the safety device includes a first metal sheet, an insulator member, and a second metal sheet. When a conductive object (hereinafter referred to as 'a nail') such as a nail penetrates the safety device and the secondary battery, a direction and a magnitude of overcurrent flowing through the nail may be determined by a resistance value of the first metal sheet and the second metal sheet. In this instance, the direction and the magnitude of overcurrent flowing through the nail are determined by various factors including not only the resistance value of the first metal sheet and the second metal sheet, but also a number of pierced secondary batteries, output voltage characteristics of the secondary battery, electrical properties of the secondary battery such as an internal resistance, and a direction of penetration, and the like. If a test is actually conducted in consideration of all these variable factors, a considerable amount of costs and time are needed. However, the overcurrent simulation method according to the present disclosure constructs equivalent circuits close to an actual secondary battery and an actual safety device using an electronic circuit analysis program operating by a microprocessor, and has an advantage of simulating a direction and a magnitude of overcurrent while considering all various factors including a resistance value of a first metal sheet and a second metal sheet, a number of pierced secondary batteries, output voltage characteristics of a secondary battery, electrical properties of a secondary battery such as an internal resistance, a direction of penetration, and the like.

The overcurrent simulation method according to the present disclosure uses an electronic circuit analysis program operating by a microprocessor. The electronic circuit analysis program represents a program capable of analyzing an electronic circuit and outputting its result, for example, Cadence Design Systems PSpice.

Accordingly, the microprocessor should receive an input of the safety device equivalent circuit and the at least two secondary battery equivalent circuits through the electronic circuit analysis program.

FIG. 1 is a secondary battery equivalent circuit diagram.

Referring to FIG. 1, it can be seen that a secondary battery equivalent circuit 100 includes a voltage source (V1-V6) exhibiting an output voltage of the secondary battery. Through output voltage value setting of the voltage source (V1-V6), various secondary batteries may be represented.

Meanwhile, an actual secondary battery has internal resistance and internal capacitance characteristics. Thus, the secondary battery equivalent circuit 100 according to the present disclosure may further include a resistor device R exhibiting an internal resistance of the secondary battery and a capacitance device C exhibiting an internal capacitance of the secondary battery.

The internal resistance of the secondary battery may be determined by properties of a material consisting of the secondary battery. Thus, the internal resistance of the secondary battery may have resistance values corresponding to a secondary battery case (R-C1~R_C10), a cathode plate (R_Cu-1~R_Cu6), a cathode active material (R_AN1~R_AN6), a separator (R-SE1~R-SE6), an anode plate (R_Al1~R_Al6), and an anode active material (R_CA1~R_CA6). The resistance values may be set by referring to properties of actual materials.

Also, when a nail penetrates the secondary battery, resistor devices for the cathode plate (R_Cu-1~R_Cu6), the cathode active material (R_AN1~R_AN6), the separator (R-SE1~R-SE6), the anode plate (R_Al1~R_Al6), and the anode active material (R_CA1~R_CA6) are electrically connected in series.

Meanwhile, in the secondary battery equivalent circuit 100, the resistor devices R_AN1~R_AN6, R_CA1~R_CA6) exhibiting the resistance of the cathode active material and the anode active material are electrically connected in parallel (C_AN1~C_AN6, C_CA1~C-CA6), respectively, in consideration of the characteristics of the internal capacitance.

The secondary battery equivalent circuit 100 needs a channel (hereinafter referred to as 'an overcurrent channel') through which an overcurrent flows in the event of nail penetration. Here, the overcurrent channel may be a new channel formed by the nail penetration.

Figure 2:
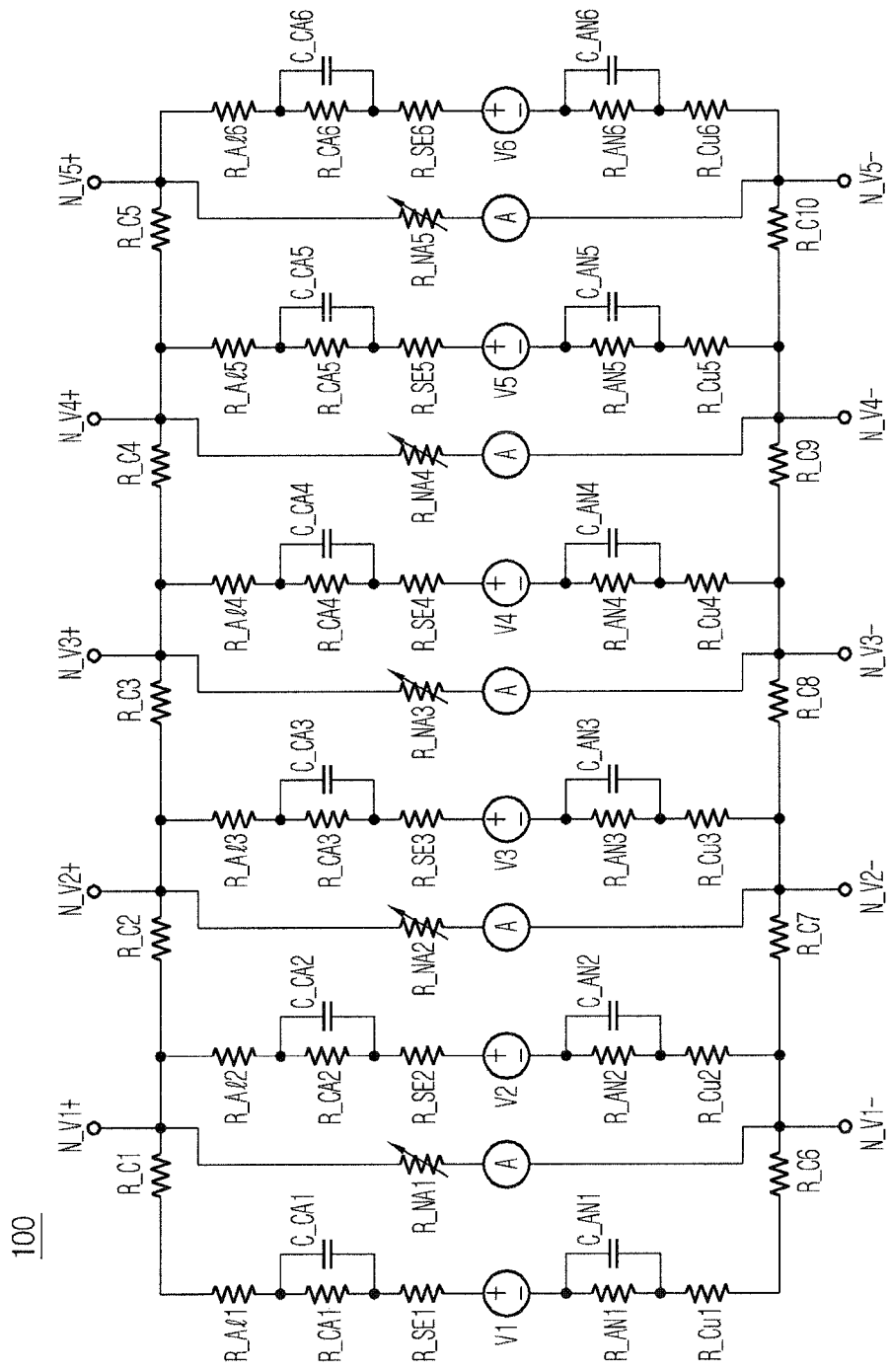
FIG. 2 is a secondary battery equivalent circuit diagram including an overcurrent channel.

FIG. 2 is a secondary battery equivalent circuit diagram including an overcurrent channel.

Referring to FIG. 2 when compared to FIG. 1, it can be seen that the overcurrent channel is added to the secondary battery equivalent circuit 100. The overcurrent channel includes variable resistor devices (R_NA1~R_NA5) and a current sensor (a current sensor symbol in the drawing) to measure a current value flowing through the variable resistor devices (R_NA1~R_NA5).

The variable resistor devices (R_NA1~R_NA5) may change in resistance value based on preset time information. In this instance, an initial value of the variable resistor devices (R_NA1~R_NA5) may be a resistance value representing an insulation state to show a state before a secondary battery is pierced.

The secondary battery equivalent circuit 100 according to the present disclosure may include a plurality of overcurrent channels.

Figure 3:
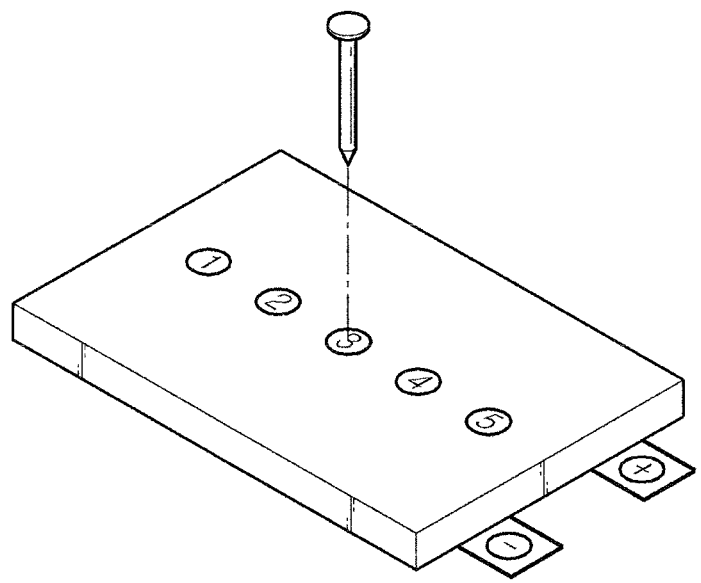
FIG. 3 is a diagram for reference to illustrate a location of penetration into a secondary battery.

FIG. 3 is a diagram for reference to illustrate a location of penetration into a secondary battery.

Referring to FIG. 3, five locations 1 to 5 where a nail may penetrate are illustrated. In case in which a nail actually penetrates a secondary battery, a direction and a magnitude of overcurrent may variously change based on a penetration location. Thus, the secondary battery equivalent circuit 100 according to the present disclosure also includes a plurality of overcurrent channels to simulate various changes based on penetration locations.

Subsequently, the microprocessor receives an input of connection wiring information between the at least two secondary battery equivalent circuits 100 and the safety device equivalent circuit 200.

Figure 4:
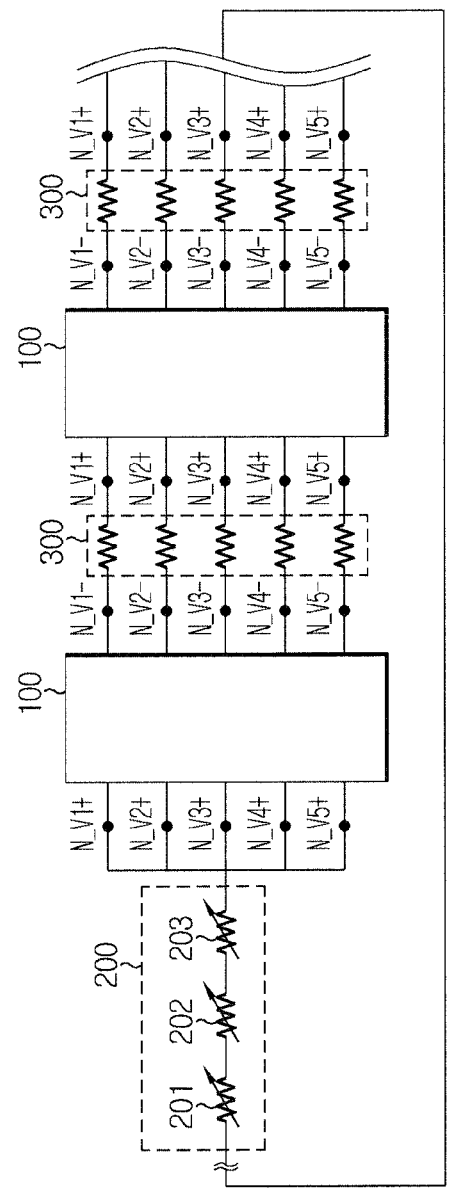
FIG. 4 is a circuit diagram showing connection wiring information of at least two secondary battery equivalent circuits and a safety device equivalent circuit according to an exemplary embodiment of the present disclosure.

FIG. 4 is a circuit diagram showing connection wiring information of the at least two secondary battery equivalent circuits 100 and the safety device equivalent circuit 200 according to an exemplary embodiment of the present disclosure.

Referring to FIG. 4, the safety device equivalent circuit 200 represented by three variable resistor devices 201, 202, and 203 on the left side of the drawing can be seen.

As described in the foregoing, the safety device includes a first metal sheet, an insulator member, and a second metal sheet. Thus, the equivalent circuit is represented using three variable resistor devices 201, 202, and 203.

Among the variable resistor devices, reference numerals 201 and 203 indicate the first metal sheet and the second metal sheet, respectively. Thus, among the variable resistor devices, reference numerals 201 and 203 may be variously set based on a resistance value of the first metal sheet and the second metal sheet.

Among the variable resistor devices, reference numeral 202 indicates the insulator member interposed between the first metal sheet and the second metal sheet. Thus, before nail penetration, the variable resistor device may have a fairly high resistance value to show an insulation state, and after nail penetration, have a value corresponding to a resistance value of the nail.

On the right side of the safety device equivalent circuit 200, the at least two secondary battery equivalent circuits 100 are connected. When actually at least two secondary batteries are electrically connected to construct a battery module, the at least two secondary batteries are connected using an element such as an electrode lead or a bus bar. Thus, the at least two secondary battery equivalent circuits 100 may be connected through a resistor device 300 exhibiting resistance, of a material consisting of an electrode lead or a bus bar, between the at least two secondary battery equivalent circuits 100.

Also, the secondary battery equivalent circuit 100 illustrated on the rightmost and the variable resistor device 201 corresponding to the first metal sheet illustrated on the leftmost of the drawing are electrically connected to construct a closed loop. Thereby, an input of an equivalent circuit and connection wiring information for overcurrent simulation is completed.

Subsequently, the microprocessor receives an input of a resistance value of the first metal sheet and the second metal sheet. As described in the foregoing, the microprocessor receives an input of a resistance value of the variable resistor devices 201 and 203.

Subsequently, the microprocessor receives time information at which a resistance value of the insulator member in the safety device and a resistance value of the overcurrent channel in the secondary battery equivalent circuit go down to a resistance value of a conductive object sequentially in an order in which the conductive object penetrates the safety device and the at least two secondary batteries. Also, as described in the foregoing, the microprocessor receives an input of time information at which a resistance value of the variable resistor device 202 indicating the insulator member in the safety device changes and a resistance value of the variable resistor device (any one of R_NA1~R_NA5) corresponding to one overcurrent channel selected among the overcurrent channels included in each secondary battery equivalent circuit 100 changes.

The microprocessor, in which all the values were input through the above steps, outputs a current value on the overcurrent channel over time using the electronic circuit analysis program.

Figure 5:
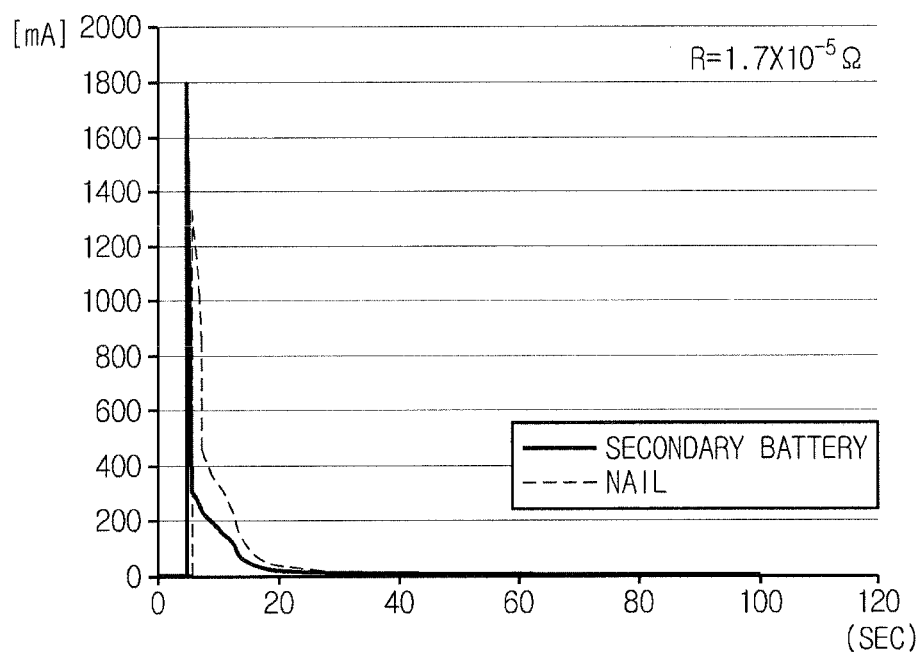
FIGS. 5 and 6 are graphs showing a change in current over time by an overcurrent simulation method according to the present disclosure.
Figure 6:
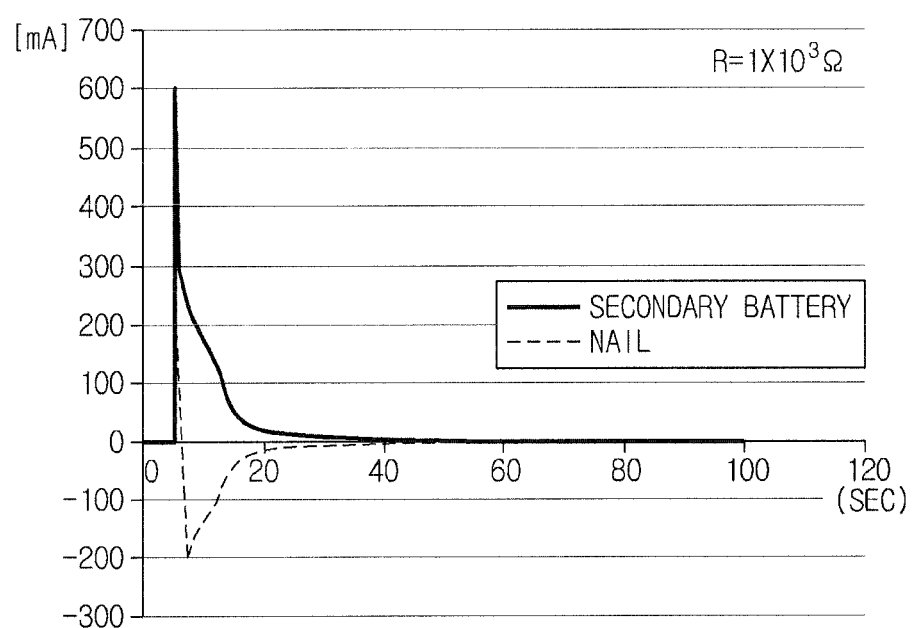

FIGS. 5 and 6 are graphs showing a change in current over time by the overcurrent simulation method according to the present disclosure.

FIGS. 5 and 6 show, when a nail penetrates a safety device and at least two secondary batteries, a direction and an amount of current flowing through the secondary battery and the nail, respectively. In FIGS. 5 and 6, a solid line indicates a direction (a current flow direction between the at least two secondary batteries) and amount of current flowing through the secondary battery, and a dotted line indicates a direction and amount of current flowing through the nail.

FIG. 5 illustrates a case in which a resistance value of the first metal sheet and the second metal sheet is set to $1.7 \times 10^{-5} \Omega$ that is relatively lower than the embodiment shown in FIG. 6. In this case, as illustrated in FIG. 5, a direction of current flowing through the secondary battery and a direction of current flowing through the nail are the same. Thus, it can be seen that an overcurrent flows in one direction.

FIG. 6 illustrates a case in which a resistance value of the first metal sheet and the second metal sheet is set to $1.0 \times 10^{3} \Omega$. In this case, as illustrated in FIG. 6, a direction of current flowing in the overcurrent channel changes from a direction opposite to a direction of current flowing in the secondary battery equivalent circuit to a same direction as the direction of current flowing in the secondary battery equivalent circuit. In addition, a magnitude of current flowing in the nail in the embodiment of FIG. 6 is relatively smaller than a magnitude of current flowing in the nail in the embodiment of FIG. 5. More specifically, an absolute value of the magnitude of current flowing in the nail in the embodiment of FIG. 6 is smaller than that of the embodiment of FIG. 5.

The overcurrent simulation method according to the present disclosure enables the microprocessor to calculate a resistance value of the first metal sheet and the second metal sheet allowing a minimum magnitude of current to flow in the nail.

That is, according to the overcurrent simulation method of the present disclosure, a resistance value of the first metal sheet and the second metal sheet allowing a minimum magnitude (absolute value) of current to flow in the nail may be calculated by carrying out simulations with a proper change of the resistance value of the first metal sheet and the second metal sheet.

The overcurrent simulation method may be stored in a recording medium in a type of a program operating by the microprocessor. In this instance, the recording medium is a high-capacity storage medium known as being capable of recording and erasing data, such as a semiconductor device or a hard disk, for example, random access memory (RAM), read-only memory (ROM), electrical erasable programmable read-only memory (EEPROM), and the like, and encompasses any device capable of storing information regardless of a device type and is not limited to a specific recording medium.

According to the present disclosure, simulations may be performed by variously setting a resistance value of the first metal sheet and the second metal sheet included in the safety device. Also, a direction and an amount of overcurrent may be estimated without an actual penetration test. Thus, a resistance value of the first metal sheet and the second metal sheet allowing an amount of overcurrent to reduce may be calculated.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. An overcurrent simulation method which simulates an overcurrent, in the event of penetration of at least two secondary batteries and a safety device, based on a resistance value of the safety device using an electronic circuit analysis program operating by a microprocessor, the overcurrent simulation method comprising:

(a) receiving, by the microprocessor, an input of:
an equivalent circuit of the safety device including a first metal sheet, an insulator member and a second metal sheet, wherein the insulator member is interposed between the first metal sheet and the second metal sheet, and the first metal sheet and the second metal sheet would be electrically connected by a conductive object when the conductive object penetrates the safety device and the at least two secondary batteries, and an equivalent circuit of at least two secondary batteries including an overcurrent channel via which an overcurrent flows in the event of penetration, through a variable resistor device;

(b) variously setting, by the microprocessor, a resistance value of a circuit equivalent of the first metal sheet and a circuit equivalent of the second metal sheet;

(c) changing, by the microprocessor, a resistance value of a circuit equivalent of the insulator member and a resistance value of the variable resistor device in the equivalent circuit of at least two secondary batteries to a resistance value of a conductive object sequentially in an order in which the conductive object penetrates the safety device and the at least two secondary batteries;

(d) outputting, by the microprocessor, a current value on a circuit equivalent of the overcurrent channel over time using the electronic circuit analysis program; and (e) calculating, by the microprocessor, a resistance value of the circuit equivalent of the first metal sheet and the circuit equivalent of the second metal sheet allowing a minimum magnitude of current to flow in the circuit equivalent of the overcurrent channel.

2. The overcurrent simulation method according to claim 1, wherein the step (a) further comprises receiving an input of connection wiring information between the equivalent circuit of at least two secondary batteries and the equivalent circuit of the safety device.

3. The overcurrent simulation method according to claim 2, wherein the equivalent circuit of at least two secondary batteries includes a voltage source exhibiting an output voltage of the equivalent circuit of at least two secondary batteries.

4. The overcurrent simulation method according to claim 3, wherein the equivalent circuit of at least two secondary batteries further comprises a resistor device exhibiting an internal resistance of the equivalent circuit of at least two secondary batteries, and a capacitance device exhibiting an internal capacitance of the equivalent circuit of at least two secondary batteries.

5. The overcurrent simulation method according to claim 4, wherein the internal resistance of the equivalent circuit of at least two secondary batteries has resistance values corresponding to a secondary battery case, a cathode plate, a cathode active material, a separator, an anode plate, and an anode active material, and resistor devices representing the cathode plate, the cathode active material, the separator, and the anode plate, and the anode active material are electrically connected in series.

6. The overcurrent simulation method according to claim 5, wherein, in the equivalent circuit of at least two secondary batteries, the internal capacitance is electrically connected in parallel to the resistor devices exhibiting the resistance of the cathode active material and the anode active material, respectively.

7. The overcurrent simulation method according to claim 6, wherein the overcurrent channel comprises the variable resistor device changing in resistance value based on preset time information, and a current sensor to measure the current value flowing through the variable resistor device.

8. The overcurrent simulation method according to claim 7, wherein an initial value of the variable resistor device is a resistance value representing an insulation state to show a state before the at least two secondary batteries is pierced.

9. A recording medium storing an electronic circuit analysis program, the electronic circuit analysis program used to simulate an overcurrent, in the event of penetration of a at least two secondary batteries and a safety device, based on a resistance value of the safety device, the recording medium comprising:

(a) receiving an input of an equivalent circuit of the safety device including a first metal sheet, an insulator member and a second metal sheet, wherein the insulator member is interposed between the first metal sheet and the second metal sheet, and the first metal sheet and the second metal sheet are electrically connected by a conductive object when the conductive object penetrates the safety device and the at least two secondary batteries and an equivalent circuit of at least two secondary batteries including an overcurrent channel via which an overcurrent flows in the event of penetration, through a variable resistor device;

(b) variously setting a resistance value of the first metal sheet and the second metal sheet;

(c) changing a resistance value of the circuit equivalent of the insulator member and a resistance value of the variable resistor device in the equivalent circuit of at least two secondary batteries to a resistance value of a conductive object sequentially in an order in which the conductive object penetrates the safety device and the at least two secondary batteries;

(d) outputting a current value on the circuit equivalent of the overcurrent channel over time using the electronic circuit analysis program; and (e) calculating a resistance value of the circuit equivalent of the first metal sheet and the circuit equivalent of the second metal sheet allowing a minimum magnitude of current to flow in the circuit equivalent of the overcurrent channel.

10. The recording medium storing an electronic circuit analysis program according to claim 9, wherein the step (a) further comprises receiving an input of connection wiring information between the equivalent circuit of at least two secondary batteries and the equivalent circuit of the safety device.

11. The recording medium storing an electronic circuit analysis program according to claim 10, wherein the equivalent circuit of at least two secondary batteries includes a voltage source exhibiting an output voltage of the equivalent circuit of at least two secondary batteries.

12. The recording medium storing an electronic circuit analysis program according to claim 11, wherein the equivalent circuit of at least two secondary batteries further comprises a resistor device exhibiting an internal resistance of the equivalent circuit of at least two secondary batteries, and a capacitance device exhibiting an internal capacitance of the equivalent circuit of at least two secondary batteries.

13. The recording medium storing an electronic circuit analysis program according to claim 12, wherein the internal resistance of the equivalent circuit of at least two secondary batteries has resistance values corresponding to a secondary battery case, a cathode plate, a cathode active material, a separator, an anode plate, and an anode active material, and resistor devices representing the cathode plate, the cathode active material, the separator, and the anode plate, and the anode active material are electrically connected in series.

14. The recording medium storing an electronic circuit analysis program according to claim 13, wherein, in the equivalent circuit of at least two secondary batteries, the internal capacitance is electrically connected in parallel to the resistor devices exhibiting the resistance of the cathode active material and the anode active material, respectively.

15. The recording medium storing an electronic circuit analysis program according to claim 14, wherein the overcurrent channel comprises the variable resistor device changing in resistance value based on preset time information, and a current sensor to measure the current value flowing through the variable resistor device.

16. The recording medium storing an electronic circuit analysis program according to claim 15, wherein an initial value of the variable resistor device is a resistance value representing an insulation state to show a state before the at least two secondary batteries is pierced.

* * * * *